(12) United States Patent
Kimura et al.

(10) Patent No.: US 12,250,787 B2
(45) Date of Patent: Mar. 11, 2025

(54) ELECTRONIC APPARATUS

(71) Applicant: Lenovo (Singapore) Pte. Ltd., Singapore (SG)

(72) Inventors: Kosei Kimura, Kanagawa (JP); Takumi Imai, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 245 days.

(21) Appl. No.: 18/046,507

(22) Filed: Oct. 14, 2022

(65) Prior Publication Data
US 2023/0209766 A1 Jun. 29, 2023

(30) Foreign Application Priority Data

Dec. 24, 2021 (JP) .................................. 2021-210601

(51) Int. Cl.
*H04R 1/02* (2006.01)
*H05K 7/20* (2006.01)

(52) U.S. Cl.
CPC ......... *H05K 7/20172* (2013.01); *H04R 1/021* (2013.01); *H04R 1/026* (2013.01);
(Continued)

(58) Field of Classification Search
CPC .............. H05K 3/366; H05K 7/20172; H05K 7/20136; H05K 7/20145; H05K 7/20154;
(Continued)

(56) References Cited

U.S. PATENT DOCUMENTS 5,339,214 A * 8/1994 Nelson .................. H01L 23/427
174/15.2
6,038,128 A * 3/2000 Hood, III ................ G06F 1/203
361/679.48
(Continued)

FOREIGN PATENT DOCUMENTS

JP 2001-156480 A 6/2001
JP 2010-061289 A 3/2010
(Continued)

OTHER PUBLICATIONS

Extended European Search Report issued in corresponding European Patent Application No. EP 22199788.5 dated May 9, 2023 (10 pages).

*Primary Examiner* — Adrian S Wilson
*Assistant Examiner* — Gage Crum
(74) *Attorney, Agent, or Firm* — Osha Bergman Watanabe & Burton LLP

(57) ABSTRACT

An electronic apparatus includes: a chassis; a substrate housed in the chassis and with a processing device mounted thereon; a speaker device housed in the chassis and having a speaker unit and a speaker box; and a cooling device housed in the chassis and used to cool the processing device. The substrate is placed vertically along the vertical direction of the chassis. The cooling device includes: a fan having air intake ports provided on upper and lower surfaces, exhaust ports provided on side surfaces, and an impeller, and being placed horizontally in the chassis with a rotating shaft of the impeller placed along the vertical direction of the chassis; a fin placed facing the exhaust port of the fan and placed horizontally in the chassis; and a heat pipe with a first end connected to the processing device and a second end connected to the fin.

10 Claims, 9 Drawing Sheets

(52) U.S. Cl.
CPC ..... *H05K 7/20145* (2013.01); *H05K 7/20154* (2013.01); *H05K 7/20409* (2013.01); *H05K 7/20445* (2013.01)

(58) Field of Classification Search
CPC ........... H05K 7/20336; H05K 7/20409; H05K 7/20445; G06F 1/16; G06F 1/20; G06F 1/181; G06F 1/184; H04R 1/021; H04R 1/026; H04R 9/022; F28D 15/0266
See application file for complete search history.

(56) References Cited

U.S. PATENT DOCUMENTS

| | | | | |
|---|---|---|---|---|
| 9,332,672 | B2* | 5/2016 | Horng | H05K 7/20154 |
| 9,749,724 | B2* | 8/2017 | Park | H04R 5/02 |
| 11,262,822 | B1* | 3/2022 | North | H05K 7/20409 |
| 11,665,869 | B2* | 5/2023 | Leclerc | G06F 1/206 |
| | | | | 361/692 |
| 2006/0005549 | A1* | 1/2006 | Ishinabe | F28D 15/0266 |
| | | | | 165/104.31 |
| 2007/0070600 | A1* | 3/2007 | Tomioka | F28D 15/0266 |
| | | | | 361/688 |
| 2008/0180915 | A1* | 7/2008 | Lin | H01L 23/4006 |
| | | | | 361/704 |
| 2008/0212289 | A1* | 9/2008 | Lin | H01L 23/4093 |
| | | | | 257/E23.084 |
| 2009/0073655 | A1* | 3/2009 | Takakusaki | H05K 1/141 |
| | | | | 361/679.55 |
| 2011/0310557 | A1* | 12/2011 | Ooe | G06F 1/20 |
| | | | | 361/692 |
| 2012/0120593 | A1 | 5/2012 | Senatori | |
| 2013/0027881 | A1* | 1/2013 | Goto | G06F 1/203 |
| | | | | 361/697 |
| 2017/0155984 | A1* | 6/2017 | Ting | H04R 1/2811 |
| 2019/0235586 | A1* | 8/2019 | Tani | H01Q 9/42 |
| 2020/0192440 | A1* | 6/2020 | Edwards | H01L 23/473 |
| 2020/0274239 | A1* | 8/2020 | Amano | H01Q 1/2266 |
| 2020/0409436 | A1* | 12/2020 | Watanabe | G06F 1/1698 |
| 2021/0243925 | A1* | 8/2021 | Ramasamy | H05K 9/0015 |
| 2021/0373606 | A1* | 12/2021 | Yang | G06F 1/1654 |

FOREIGN PATENT DOCUMENTS

| | | |
|---|---|---|
| JP | 2012-003130 A | 1/2012 |
| JP | 2020-140406 A | 9/2020 |
| JP | 2020-178244 A | 10/2020 |
| JP | 2021-005272 A | 1/2021 |

* cited by examiner

ELECTRONIC APPARATUS

CROSS-REFERENCE TO RELATED APPLICATIONS

This application claims priority to Japanese Patent Application No. 2021-210601 filed on Dec. 24, 2021, the contents of which are hereby incorporated herein by reference in their entirety.

TECHNICAL FIELD

The present invention relates to an electronic apparatus available as a terminal device for teleconferencing.

BACKGROUND

Currently, there are used electronic apparatuses that allow remote conferences and calls via audio and video by using the Internet, telephone lines, or the like. This type of electronic apparatus is equipped with a speaker device for outputting audio and other sounds from the other party (for example, refer to Japanese Unexamined Patent Application Publication No. 2020-178244).

In recent years, a demand for online conferencing using displays has been increasing. For this reason, there is a request for using the above-mentioned electronic apparatus on a wall above or below a large wall-mounted display, for example. In this case, the electronic apparatus is required to minimize the depth dimension of a chassis to reduce the protrusion length from the wall.

In addition to a speaker device, however, this type of electronic apparatus may contain a substrate with a processing device for control, a cooling device for cooling the processing device, and the like, and these parts need to be housed in the chassis within the depth dimension limitations. Naturally, it is also desirable for this type of electronic apparatus to have a small depth dimension in the case where it is placed on a desk or the like.

One or more embodiments of the present invention provide an electronic apparatus capable of reducing the depth dimension of the chassis while housing a plurality of parts.

SUMMARY

An electronic apparatus according to one or more embodiments of the present invention includes: a chassis; a substrate housed in the chassis and with a processing device mounted thereon; a speaker device housed in the chassis and having a speaker unit and a speaker box; and a cooling device housed in the chassis and used to cool the processing device, wherein the substrate is placed vertically along the vertical direction of the chassis, and wherein the cooling device includes: a fan having air intake ports provided on upper and lower surfaces, exhaust ports provided on side surfaces, and an impeller, and being placed horizontally in the chassis with a rotating shaft of the impeller placed along the vertical direction of the chassis; a fin placed facing the exhaust port of the fan and placed horizontally in the chassis; and a heat pipe with a first end connected to the processing device and a second end connected to the fin. This allows the electronic apparatus to minimize the depth dimension of the chassis by placing the substrate vertically and the fan and the fin horizontally, while housing the substrate, the speaker device, and the cooling device inside the chassis.

An electronic apparatus according to one or more embodiments of the present invention includes: a chassis; a substrate housed in the chassis and with a processing device mounted thereon; a speaker device housed in the chassis and having a speaker unit and a speaker box; and a cooling device housed in the chassis and used to cool the processing device, wherein the cooling device includes: a fan having air intake ports provided on upper and lower surfaces, exhaust ports provided on side surfaces, and an impeller, with a rotating shaft of the impeller placed along the vertical direction of the chassis; a fin placed facing the exhaust port of the fan; a heat pipe with a first end connected to the processing device and a second end connected to the fin; and a duct part placed facing the fin under the speaker box and used to distribute air having left the exhaust port and passed through the fin to the outside of the chassis. This allows the electronic apparatus to efficiently house the parts in the chassis while minimizing the depth dimension D of the chassis, since the parts of the cooling device are placed along the horizontal direction of the chassis and the speaker box is placed thereabove.

According to the above-described aspects of the present invention, one or more embodiments of the present invention provide an electronic apparatus capable of reducing the depth dimension of the chassis while housing a plurality of parts.

DETAILED DESCRIPTION

An electronic apparatus according to the present invention will be described in detail below with reference to the accompanying drawings, by giving preferable embodiments.

Figure 1:
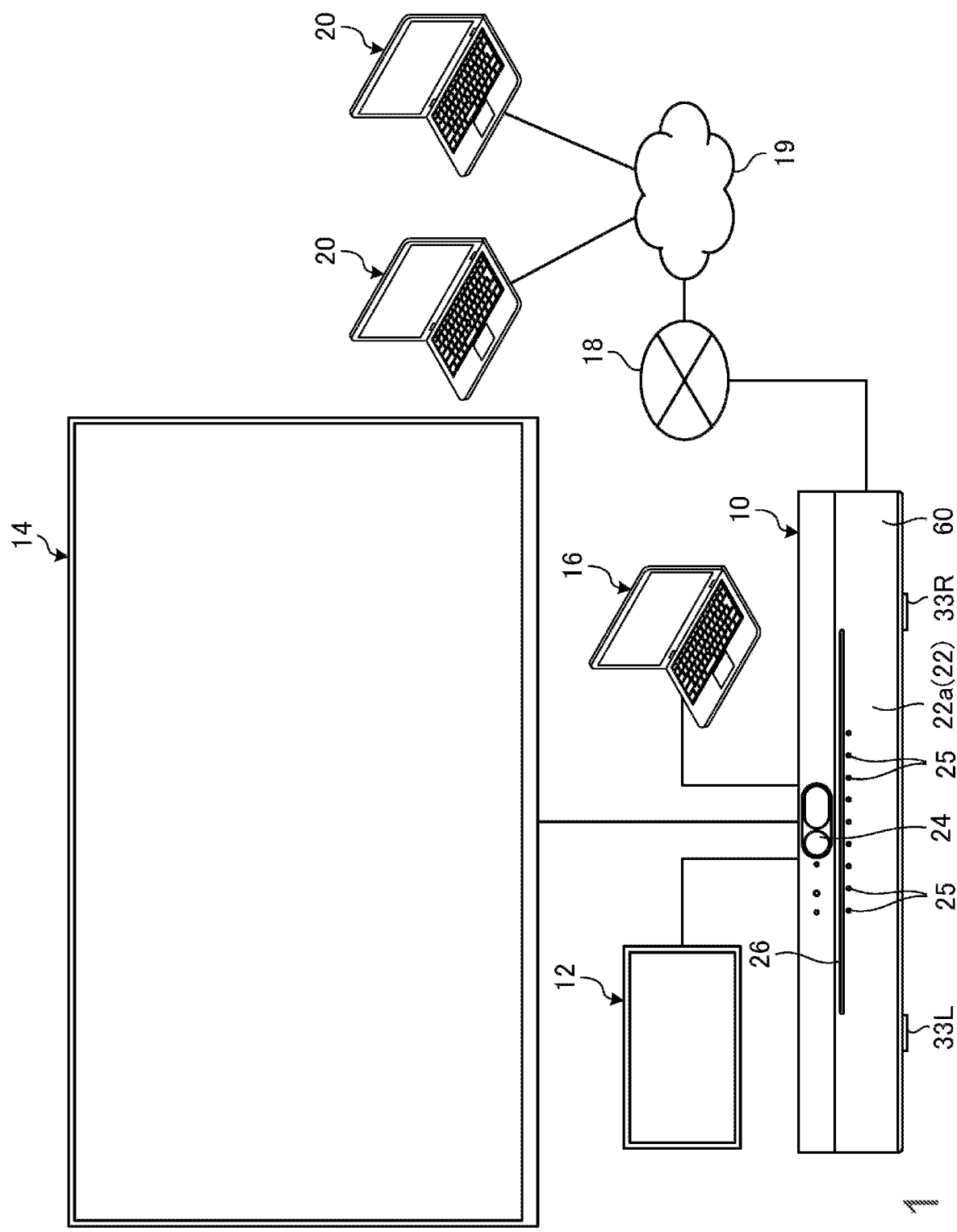
FIG. 1 is a system diagram illustrating one mode of using an electronic apparatus according to one or more embodiments.

FIG. 1 is a system diagram illustrating one mode of using an electronic apparatus 10 according to one or more embodiments. The electronic apparatus 10 of one or more embodiments is a terminal device capable of being used, for example, in an online conference system for conducting conferences and calls using audio and video between remote locations connected via the Internet.

The online conference system illustrated in FIG. 1 includes an electronic apparatus 10 according to one or more embodiments, a touch panel operation unit 12, an external display 14, and a personal computer 16. As illustrated in FIG. 1, the electronic apparatus 10 is fixed on a wall above or below the external display 14, which is fixed on the wall in a conference room, for example. The electronic apparatus 10 is also able to be placed on a table or the like when it is used.

The touch panel operation unit 12 is a touch panel terminal for input operation to the electronic apparatus 10. The external display 14 is able to display, for example, information from the personal computer 20 of the other party of the conference connected to the electronic apparatus 10 via the Internet 18 and the cloud server 19. Specifically, the external display 14 displays the face images and documents of the other party of the conference under the control of the electronic apparatus 10. The personal computer 16 is able to transmit, for example, documents or the like from a user of the electronic apparatus 10 to the external display 14 and the other party's personal computer 20. The personal computer 16 may be used for input operation to the electronic apparatus 10 instead of the touch panel operation unit 12.

The electronic apparatus 10 is connected to the touch panel operation unit 12, the external display 14, and the personal computer 16 by using connectors and cables conforming to prescribed connection standards, such as, for example, USB and HDMI (registered trademark) standards.

First, the external structure of the electronic apparatus 10 is described.

Figure 2A:
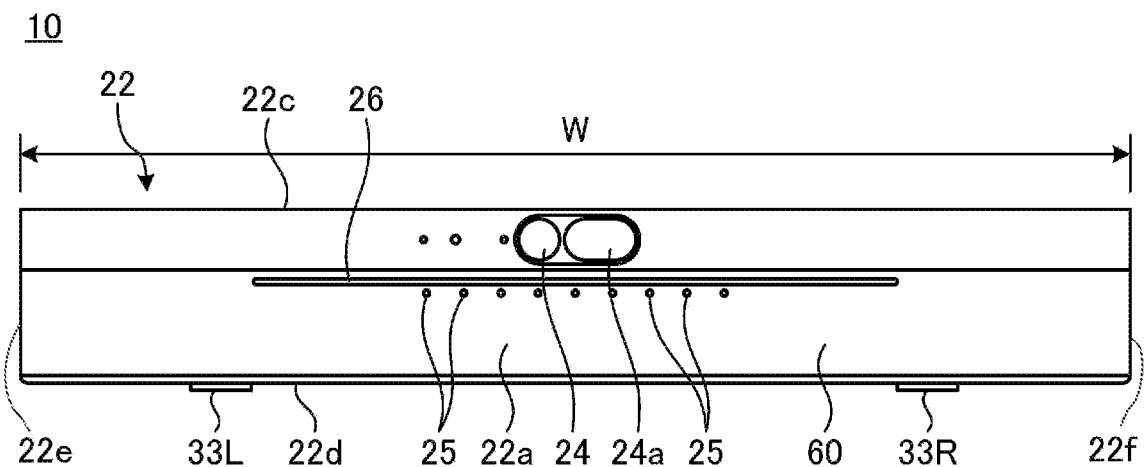
FIG. 2A is a front view of the electronic apparatus.
Figure 2B:
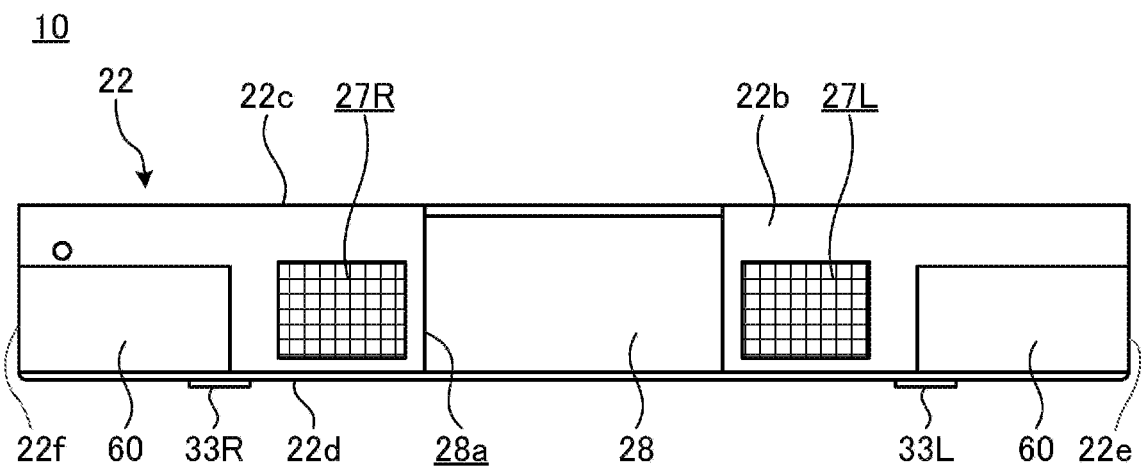
FIG. 2B is a rear view of the electronic apparatus.
Figure 2C:
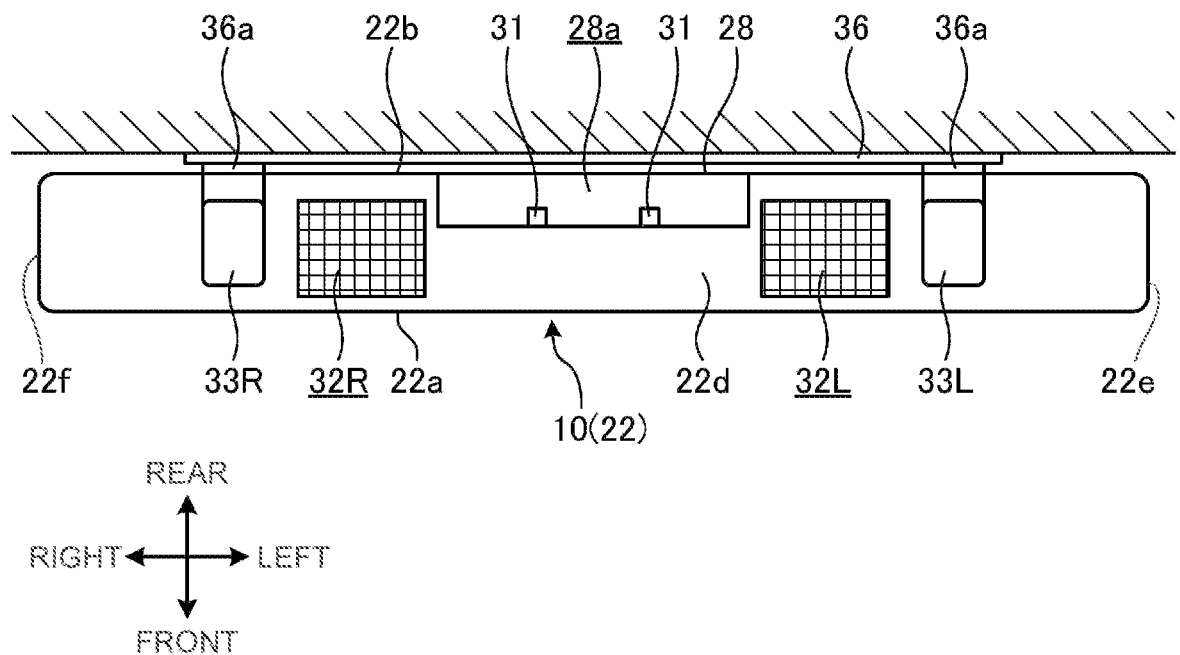
FIG. 2C is a bottom view of the electronic apparatus.
Figure 2D:
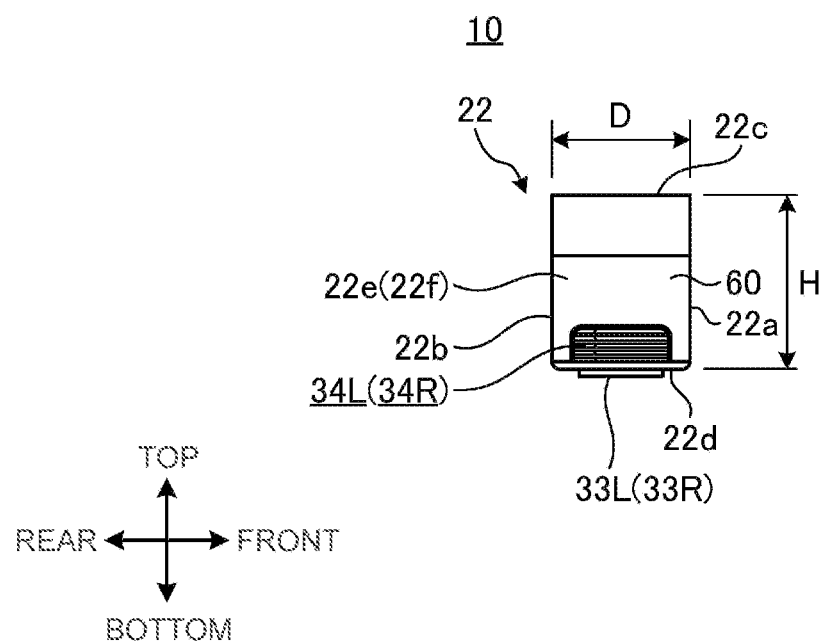
FIG. 2D is a side view of the electronic apparatus.

FIGS. 2A, 2B, 2C, and 2D are a front view, a rear view, a bottom view, and a side view of the electronic apparatus 10, respectively. FIG. 2D illustrates the left side view of the electronic apparatus 10, while the right-side view is symmetrical to the left-side view.

As illustrated in FIGS. 2A to 2D, the electronic apparatus 10 has a chassis 22. Hereinafter, the electronic apparatus 10 and the elements thereof are described by referring to the direction of the height of the chassis 22 as the top and bottom, the direction of the width of the chassis 22 as the left and right, and the direction of the depth of the chassis 22 as the front and back, with reference to the direction of the front view illustrated in FIG. 2A.

The chassis 22 is a substantially rectangular parallelepiped box body with a horizontal bar shape. Specifically, the front surface 22a and the rear surface 22b of the chassis 22 each have a horizontally-long width dimension W and a height dimension H, which is smaller than the width dimension W. The upper surface 22c and the lower surface 22d of the chassis 22 each have a horizontally-long width dimension W and a depth dimension D, which is smaller than the width dimension W and narrower in the front-back direction. The left side surface 22e and the right side surface 22f of the chassis 22 each have a narrow depth dimension D in the front-back direction and a vertical height dimension H slightly larger than the depth dimension D.

As illustrated in FIG. 2A, a camera 24, a microphone 25, and a light 26 are provided on the front surface 22a.

The camera 24 is a camera device for capturing images of a user located on the front side of the electronic apparatus 10. The camera 24 is placed in the upper part of the front surface 22a, roughly in the center of the left and right sides thereof. A reference numeral 24a in FIG. 2a indicates a sliding shutter capable of physically shielding the camera 24. The microphone 25 is a microphone device that collects the voice and other sounds of the user of the electronic apparatus 10. The microphone 25 faces the front surface 22a through a plurality of microphone holes arranged in the horizontal direction below the camera 24. The light 26 is a light notification portion for notifying the user of the operating state of the electronic apparatus 10 and the sound collection state of the microphone 25 or the like, and is also called a smart light. The light 26 faces the front surface 2a through a horizontally-long narrow light-transmitting window provided between the camera 24 and the microphone 25. On the front surface 22a, there is also provided a power light or the like of the electronic apparatus 10.

As illustrated in FIG. 2B, on the rear surface 22b, there are provided a pair of left and right rear air intake ports 27L and 27R and a cover plate 28.

The rear air intake ports 27L and 27R are openings that communicate the inside and outside of the chassis 22. The rear air intake ports 27L and 27R have, for example, a mesh structure with a large number of holes or a structure with a plurality of slits arranged in parallel. The rear air intake port 27L is provided on the left side and the rear air intake port 27R is provided on the right side, relative to the horizontal center of the rear surface 22b.

Figure 3:
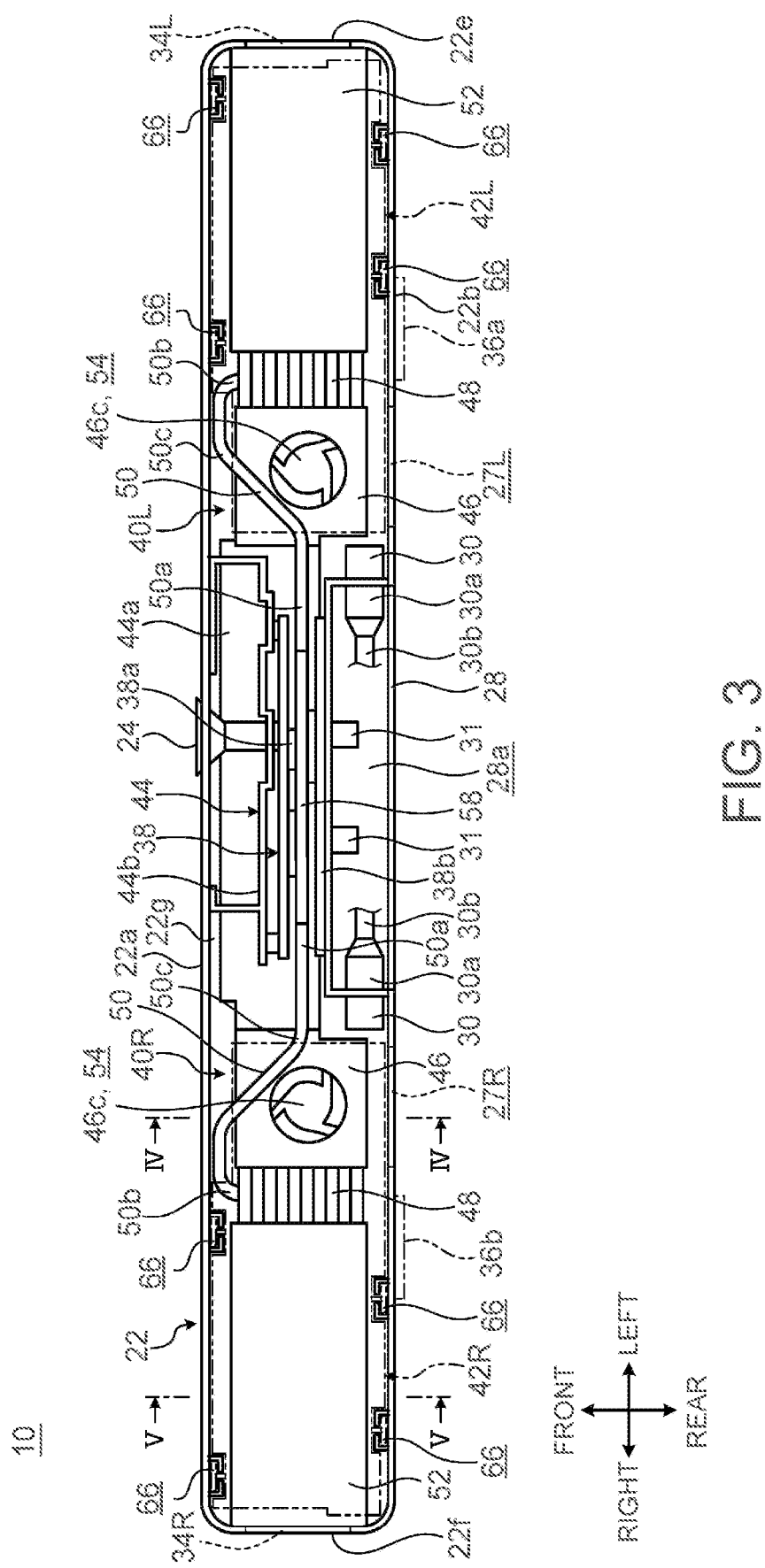
FIG. 3 is a plan view schematically illustrating the internal structure of the electronic apparatus according to one or more embodiments.

The cover plate 28 is a removable plate for hiding a concave portion 28a formed at the left-to-right center of the rear surface 22b as illustrated in FIG. 2C. In the concave portion 28a, a connection terminal portion 30 is arranged (see FIG. 3). The connection terminal portion 30 is an external terminal group to which a connector 30a is connected to connect the electronic apparatus 10 to the touch panel operation unit 12, the external display 14, the personal computer 16, and the Internet 18 or the like. The cables 30b and connectors 30a from these external devices are housed in the concave portion 28a and hidden by the cover plate 28. The reference numeral 31 in FIG. 3 is a pedestal on which a cable tie band is hooked for bundling the cables 30b. In addition, a power cable for connecting the electronic apparatus 10 to an external power supply is connected to the connection terminal portion 30.

As illustrated in FIG. 2C, there are provided a pair of left and right bottom air intake ports 32L and 32R and a pair of left and right rubber feet 33L and 33R on the lower surface 22d. The upper surface 22c has an outline substantially identical to the outline of the lower surface 22d, but is formed of a flat plate.

Bottom air intake ports 32L and 32R are openings that communicate the inside and outside of the chassis 22. The bottom air intake ports 32L and 32R may have a mesh or slit structure similar to that of the rear air intake ports 27L and 27R. With reference to the horizontal direction of the chassis 22, the bottom air intake port 32L is provided at substantially the same position as the rear air intake port 27L, and the bottom air intake port 32R is provided at substantially the same position as the rear air intake port 27R (see also FIG. 8).

The rubber feet 33L and 33R are legs for using the electronic apparatus 10 placed on a table or the like. The rubber feet 33L and 33R are placed to straddle the left and right bottom air intake ports 32L and 32R, and are fixed at positions somewhat closer to the center of the lower surface 22d than the left and right ends of the lower surface 22d. The rubber feet 33L and 33R are required to prevent the bottom air intake ports 32L and 32R from being blocked when the electronic apparatus 10 is placed on a table or the like. In other words, the rubber feet 33L and 33R need to be high enough to secure the air passage to the bottom air intake ports 32L and 32R. In one or more embodiments, the height of the rubber feet 33L and 33R is, for example, about 5 mm.

As illustrated in FIG. 2D, a side exhaust port 34L is provided on the left side surface 22e.

The side exhaust port 34L is an opening that communicates the inside and outside of the chassis 22. The side exhaust port 34L may have a mesh or slit structure similar to that of the rear air intake ports 27L and 27R. The side exhaust port 34L is provided at the lowermost part of the left side surface 22e. The right side surface 22f is symmetrical to the left side surface 22e illustrated in FIG. 2D and is provided with a side exhaust port 34R (see FIG. 3).

As described above, the electronic apparatus 10 is able to be mounted on a wall of a conference room or the like without using the rubber feet 33L and 33R. In the case of being mounted on a wall, the electronic apparatus 10 is used after attaching a bracket plate 36 to the rear surface 22b, as illustrated in FIG. 2C. The bracket plate 36 is a metal plate long in the horizontal direction, and the connecting plates 36a and 36b protruding from the left and right surfaces are fixed to the rear surface 22b with screws or the like. The connecting plates 36a and 36b are connected to cooling devices 40L and 40R and to speaker devices 42L and 42R described later in overlapping positions with reference to the horizontal direction of the chassis 22 (see FIG. 3). This allows the electronic apparatus 10 to be easily installed on a wall by fixing the bracket plate 36 to the wall with screws or the like.

The internal structure of the electronic apparatus 10 is then described.

FIG. 3 is a plan view schematically illustrating the internal structure of the electronic apparatus 10. FIG. 3 is a top view of the inside of the chassis 22 with the plate forming the upper surface 22c of the chassis 22 removed.

As illustrated in FIG. 3, the electronic apparatus 10 houses a substrate 38, a pair of left and right cooling devices 40L and 40R, and a pair of left and right speaker devices 42L and 42R inside the chassis 22.

The substrate 38 is a motherboard of the electronic apparatus 10. In addition to a processing device 38a, various electronic components such as a memory, a solid state drive (SSD), and the like are mounted on the substrate 38. The processing device 38a is, for example, a central processing unit (CPU).

A bracket 44 is fixed to the inside of the chassis 22 with screws or the like. The substrate 38 is fixed to the bracket 44, which supports the substrate 38 in the chassis 22. The bracket 44 is a metal plate having a horizontal bracket 44a and a vertical bracket 44b, and is configured substantially in a T-shape. The horizontal bracket 44a is a plate-like member that is placed horizontally along a bottom surface 22g in the chassis 22. The vertical bracket 44b is a plate-like member that rises upward from the upper surface of the horizontal bracket 44a and is placed vertically along the front surface 22a and the rear surface 22b.

The substrate 38 is fixed to the back surface of the vertical bracket 44b by screws or the like. This allows the substrate 38 to be placed vertically along a downward direction in the chassis 22 (see also FIG. 4). In other words, the substrate 38 is installed with its plane directions along the vertical and horizontal directions and its thickness direction along the front-back direction.

The fore surface of the substrate 38 serves as the attachment surface for the bracket 44, and the back surface of the substrate 38 serves as the mounting surface for the processing device 38a and the like. A sub card 38b is connected to the mounting surface of the substrate 38 at a predetermined distance. The sub card 38b is also supported by the vertical bracket 44b and placed vertically in the chassis 22.

Figure 4:
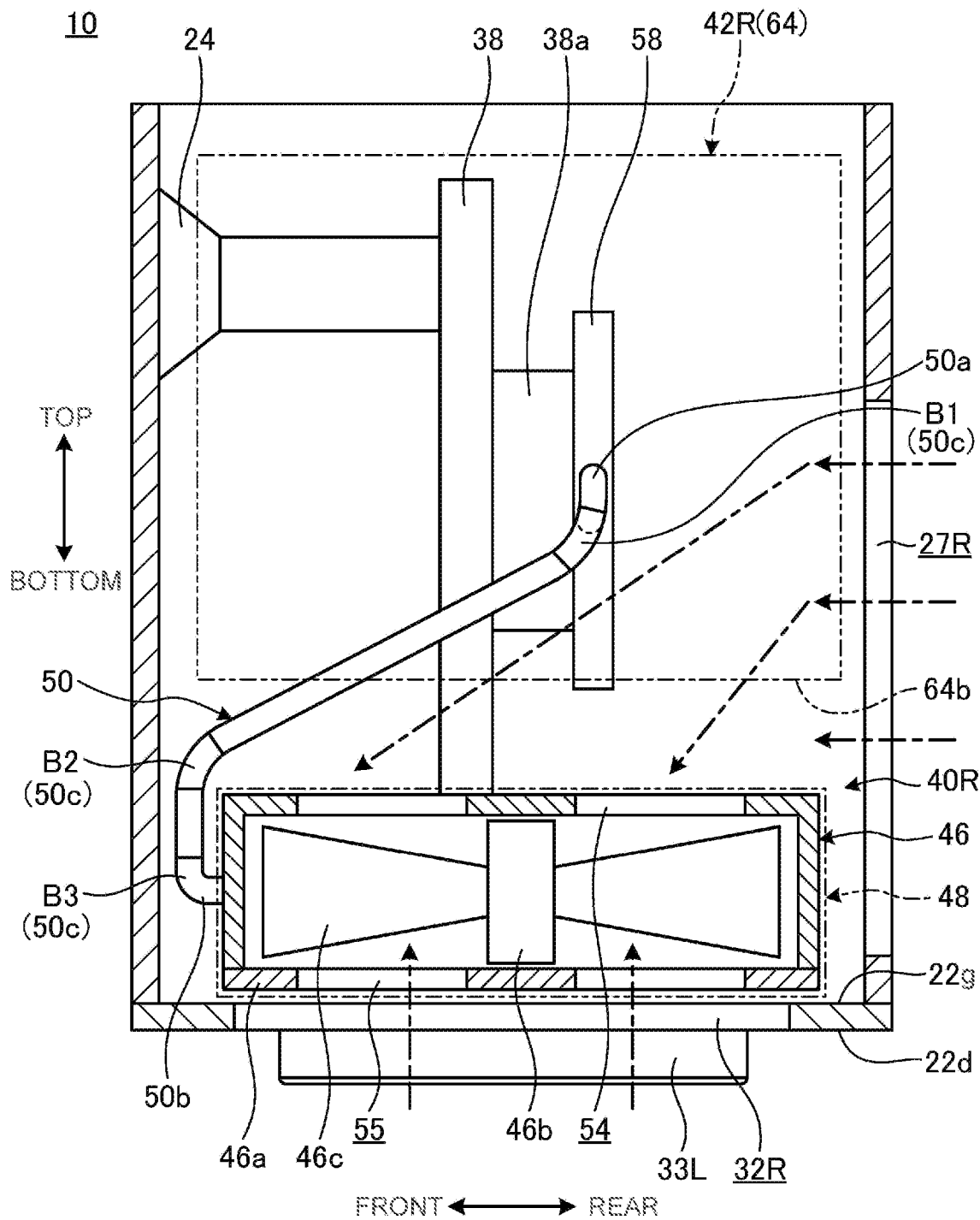
FIG. 4 is a schematic cross section along line IV-IV in FIG. 3.
Figure 5:
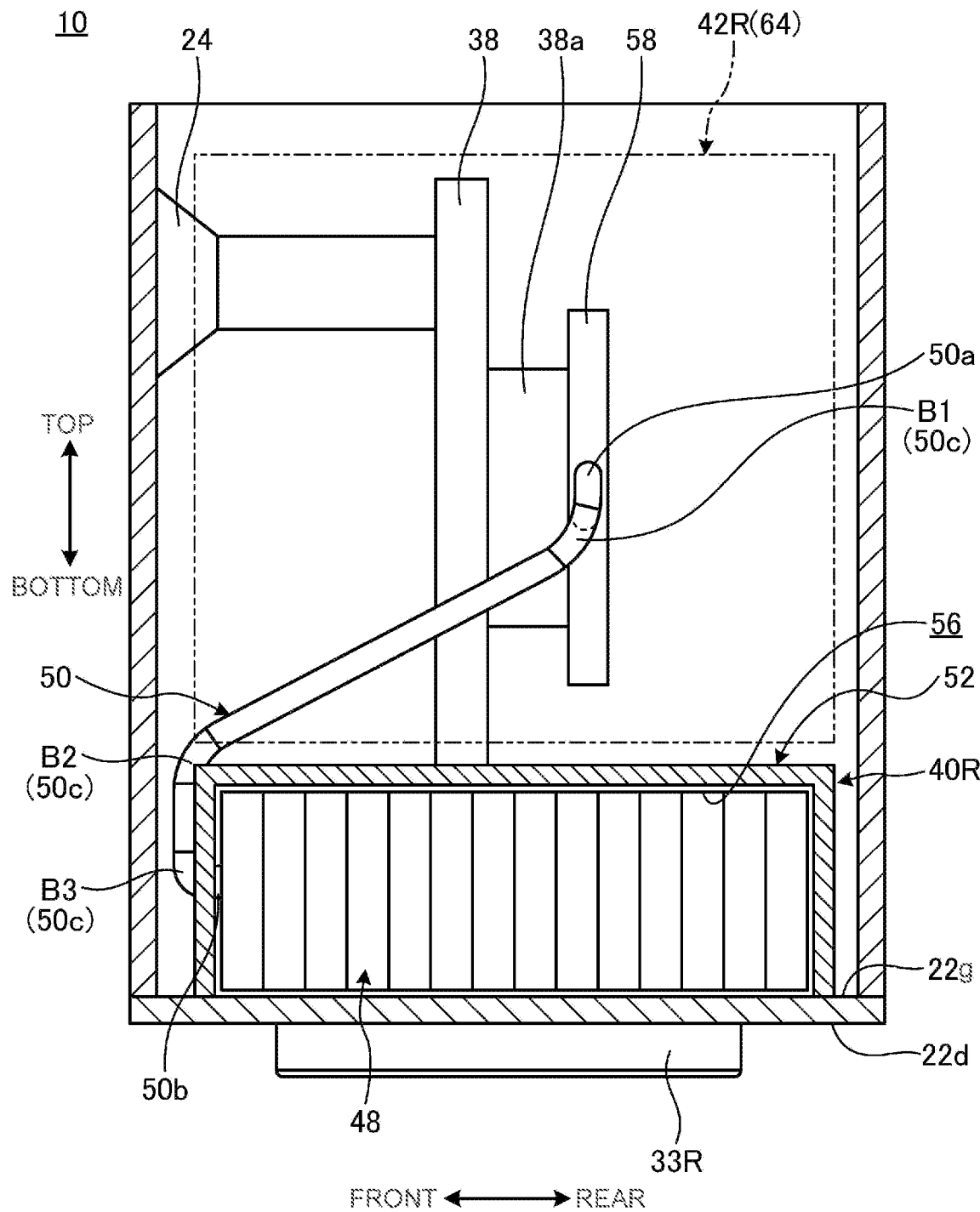
FIG. 5 is a schematic cross section along line V-V in FIG. 3.
Figure 6:
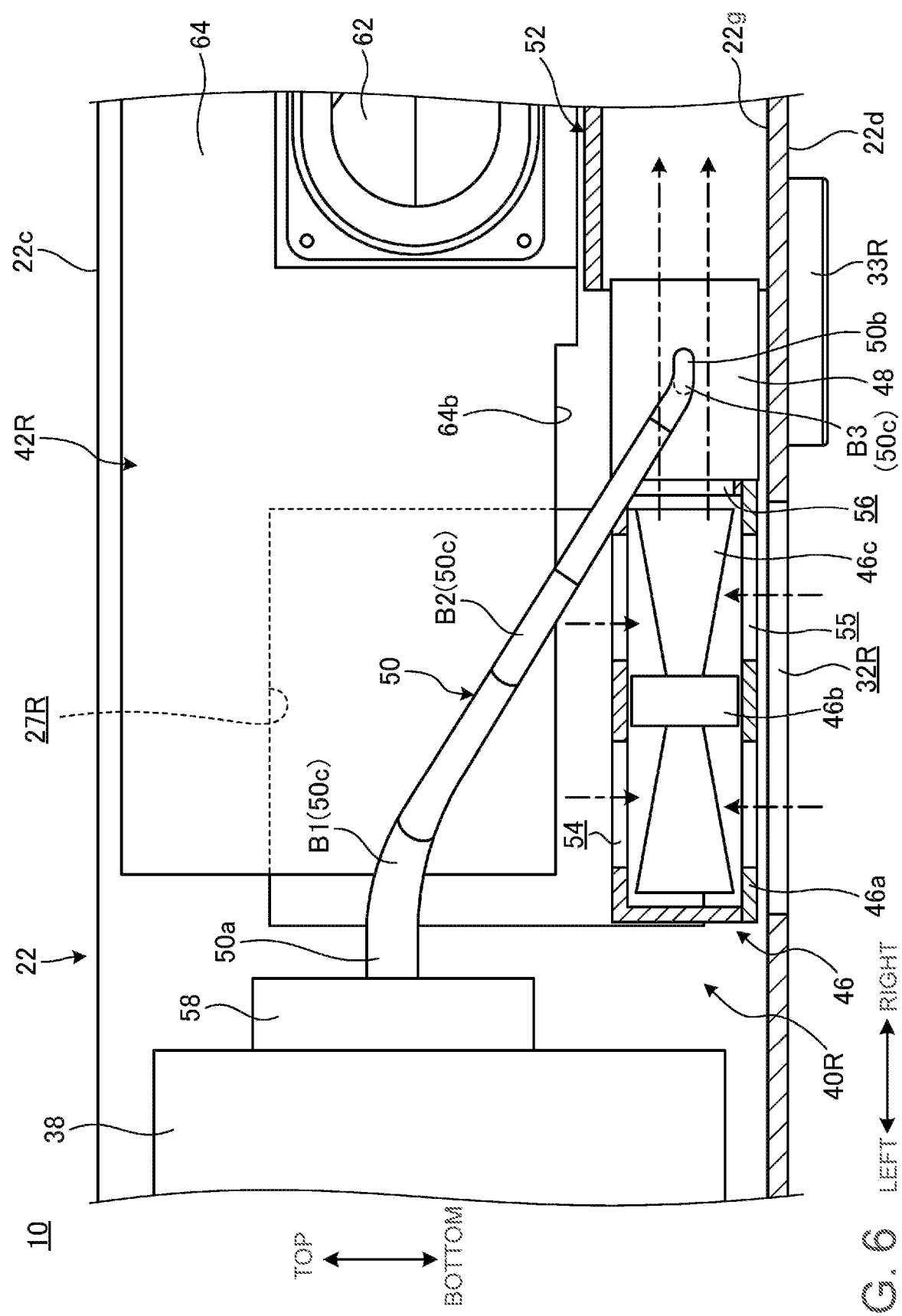
FIG. 6 is a schematic front cross-sectional view of a right-side cooling device and its surroundings illustrated in FIG. 3.
Figure 7A:
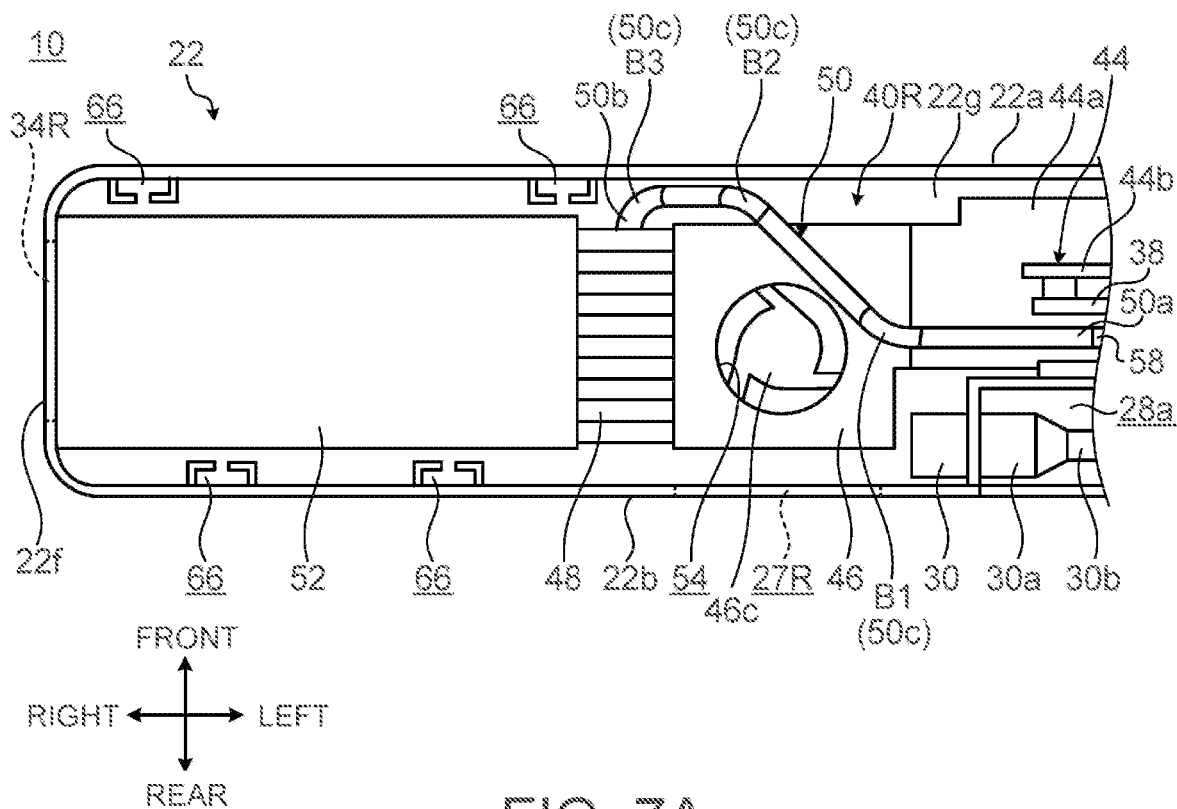
FIG. 7A is a schematic enlarged view of the right-side cooling device and its surroundings illustrated in FIG. 3.

FIG. 4 is a schematic cross section along line IV-IV in FIG. 3. FIG. 5 is a schematic cross section along line V-V in FIG. 3. FIGS. 4 and 5 each illustrate the configuration of the right-side cooling device 40R and its surroundings illustrated in FIG. 3. The bracket 44, the sub card 38b, and the like are not illustrated in FIGS. 4 and 5. FIG. 6 is a schematic front cross sectional view of the right-side cooling device 40R and its surroundings illustrated in FIG. 3. FIG. 7A is a schematic enlarged view of the right-side cooling device 40R and its surroundings illustrated in FIG. 3. The bracket 44 and other parts are not illustrated in FIG. 6.

As illustrated in FIG. 3, the cooling devices 40L and 40R are symmetrical, and the speaker devices 42L and 42R are similarly symmetrical. Therefore, the following typically describes the right-side cooling device 40R and speaker device 42R, and omits detailed descriptions of the left-side cooling device 40L and speaker device 42L.

The cooling devices 40L and 40R cool the processing device 38a and other electronic components mounted on the substrate 38.

As illustrated in FIGS. 3 to 7A, the cooling device 40R has a fan 46, a fin 48, a heat pipe 50, and a duct part 52.

The fan 46 has a fan chassis 46a, a rotating shaft portion 46b and an impeller 46c housed in the fan chassis 46a. The fan 46 is a centrifugal fan in which the impeller 46c provided on the outer peripheral side rotates by the rotation of the rotating shaft portion 46b caused by a motor. The fan 46 is placed horizontally in the chassis 22, with the axis of rotation of the impeller 46c, in other words, the axis direction of the rotating shaft portion 46b, aligned with the vertical direction of the chassis 22. More specifically, the fan 46 is fixed to the lower surface of the horizontal bracket 44a of the bracket 44, and is placed horizontally along the bottom surface 22g of the chassis 22, with only a small gap formed between the fan 46 and the bottom surface 22g. The fan 46 may be placed on the bottom surface 22g.

The fan 46 has an upper air intake port 54, a lower air intake port 55, and an exhaust port 56.

The upper air intake port 54 is an opening formed in the upper surface of the fan chassis 46a. The lower air intake port 55 is an opening formed in the lower surface of the fan chassis 46a. The air intake ports 54 and 55 are through holes that are, for example, circular, doughnut-shaped, or have a shape with a plurality of ellipses arranged in a circumferential direction. The upper air intake port 54 overlaps the rear air intake port 27R in the horizontal direction, and air is mainly drawn through the rear air intake port 27R. The lower air intake port 55 is opposite to the bottom air intake port 32R and air is mainly drawn through the bottom air intake port 32R. The exhaust port 56 is an opening formed in the side surface of the fan chassis 46a facing the opposite side of the substrate 38 in the horizontal direction. In other words, the exhaust port 56 is formed in the right side surface of the fan chassis 46a for the cooling device 46R and formed in the left side surface of the fan chassis 46a for the cooling device 46L.

The fin 48 is a heat sink made of a plurality of thin metal plates arranged at equal intervals. The fin 48 is placed facing the exhaust port 56 of the fan 46. In other words, the fin 48 faces the right side surface of the fan chassis 46a for the cooling device 46R and faces the left side surface of the fan chassis 46a for the cooling device 46L. The metal plates constituting the fin 48 are erected in the vertical direction and extended in the horizontal direction, so as to be parallel to each other in the front-back direction. This forms a gap between adjacent metal plates through which air from the fan 46 passes.

The heat pipe 50 is a pipe-type heat transport device. The heat pipe 50 is made of a metal pipe that is flattened and formed into an oval cross section, and the working fluid is sealed in a sealed space inside. A first end 50a of the heat pipe 50 is connected to the processing device 38a via a heat receiving plate 58, and a second end 50b is connected to the fin 48. The heat receiving plate 58 is formed of a metal with high thermal conductivity such as copper or aluminum. The heat receiving plate 58 is used to bring the processing device 38a or the like and the heat pipe 50 into close contact with each other without any gap, so as to increase the heat transfer efficiency.

In the electronic apparatus 10 of one or more embodiments, the substrate 38 is placed vertically, and the fin 48 is placed horizontally along with the fan 46 so as to be close to the bottom surface 22g. In other words, the processing device 38a is placed above the fin 48 in the vertical direction of the chassis 22. In addition, the processing device 38a and the heat receiving plate 58 are located substantially in the center of the chassis 22 in the front-back direction. On the other hand, the fin 48 extends substantially over the entire length of the inside dimension of the chassis 22 in the front-back direction to maximize the heat dissipation area of the fin 48. The first end 50a of the heat pipe 50 is fitted into a groove formed in the back surface of the heat receiving plate 58, and is practically connected to the side end surface of the heat receiving plate 58. The second end 50b is connected to the front end surface of the fin 48.

Therefore, the positional relationship between the first end 50a and the second end 50b of the heat pipe 50 is out of alignment in the vertical, horizontal, and front-back directions. Therefore, the heat pipe 50 has a bending portion 50c three-dimensionally curved in the vertical, horizontal, and front-back directions between the ends 50a and 50b.

As illustrated in FIGS. 4, 6 and 7A, the bending portion 50c in one or more embodiments has a first bending portion B1, a second bending portion B2, and a third bending portion B3, in order from the first end 50a to the second end 50b.

The bending direction at the bending portion 50c is described below by illustrating how the extension direction of the heat pipe 50, that is, the axis direction of the pipes constituting the heat pipe 50, varies in the vertical, horizontal, front-back directions of the chassis 22. In addition, as described above, the following description is an example of the bending direction of the heat pipe 50 of the right-side cooling device 50R. The bending direction of the heat pipe 50 of the left-side cooling device 50L is left-right reversed to the bending direction of the heat pipe 50 of the right-side cooling device 50R.

The first end 50a is connected to the right side end surface of the heat receiving plate 58 placed vertically and extends along the horizontal direction. The first bending portion B1 is curved in the direction from the first end 50a to the second end 50b (hereinafter, referred to as "first direction") so as to be gradually twisted to the right, forward, and downward at the same time.

Between the first bending portion B1 and the second bending portion B2, there is a straight-line portion going to the right in the first direction while going forward diagonally down. The second bending portion B2 is curved in the first direction, gradually twisting to the right and down at the same time.

Between the second bending portion B2 and the third bending portion B3, there is a straight-line portion which is diagonally rightward and downward in the first direction. The third bending portion B3 is curved in the first direction so as to be gradually twisted to the right, backward, and downward at the same time. The second end 50b extends shortly in the front-back direction and is connected to the front side surface of the fin 48 placed horizontally.

Needless to say, the bending direction of the bending portion 50c is not limited to the bending direction with the bending portions B1 to B3 described above. In other words, the bending direction of the bending portion 50c may be changed to each direction on the basis of the positional relationship between the heat receiving plate 58 and the fin 48 and the positional relationship with other parts. The number of bends in the bending portion 50c may be other than 3. Preferably, however, the bending portion 50c is not bent at a right angle, for example, in order to avoid the collapse of the sealed space inside the heat pipe 50. It is also preferable to make the entire length of the heat pipe 50 as short as possible. In this respect, in the arrangement of the heat receiving plate 58 and the fin 48 in one or more embodiments, the configuration with the bending portions B1 to B3 described above is preferable.

As illustrated in FIGS. 5 to 7A, the duct part 52 forms an air duct for directing air having passed through the fin 48 from the exhaust port 56 of the fan 46 to the side exhaust port 34R. The duct part 52 is a plastic or metal part. The duct part 52 includes a substantially U-shaped plate with three sides perpendicular to each other, for example. The height of the duct formed by the duct part 52 is the same as or slightly higher than the height of the fin 48. The front-to-back width of the duct formed by the duct part 52 is the same as or slightly wider than the front-to-back width of the fin 48.

The duct part 52 may be formed of a square tube with a rectangular cross section. In one or more embodiments, the bottom surface 22g of the flat chassis 22 serves as a bottom wall of the duct formed by the duct part 52, and therefore the duct part 52 has an approximate U-shape without a bottom plate.

Figure 7B:
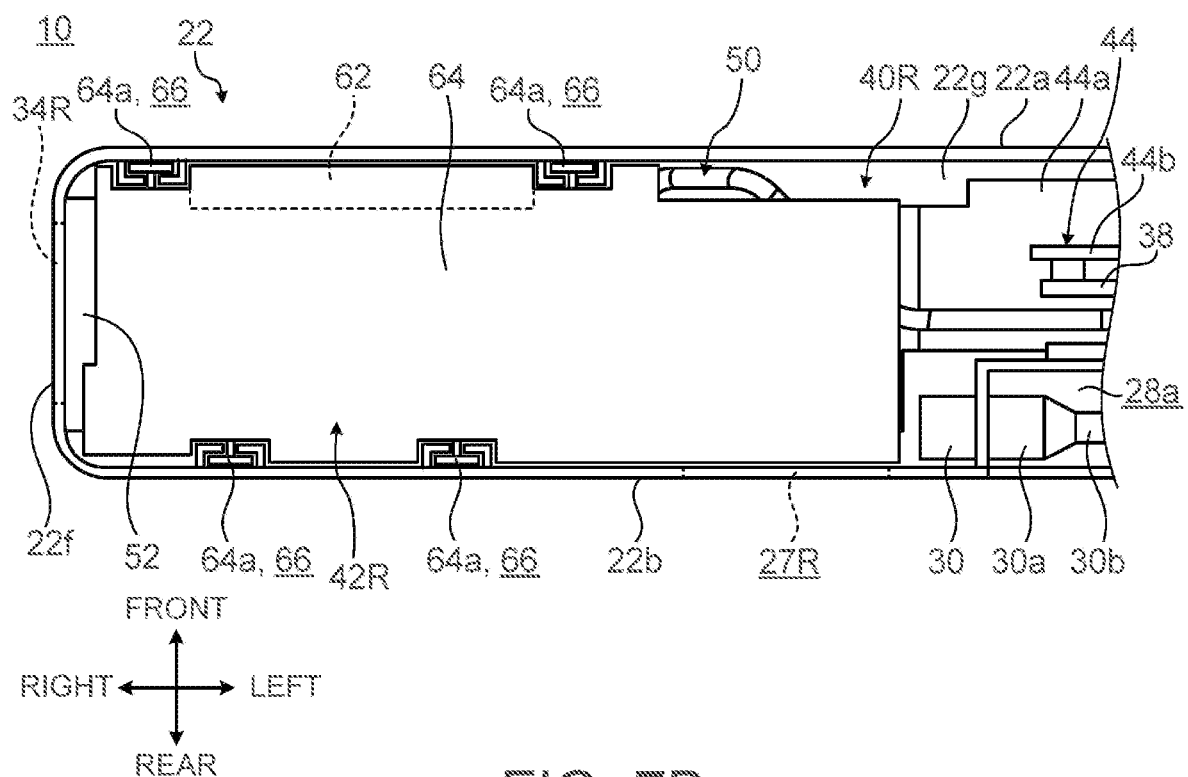
FIG. 7B is a diagram illustrating a state where a speaker device is installed above the right-side cooling device illustrated in FIG. 7A.
Figure 8:
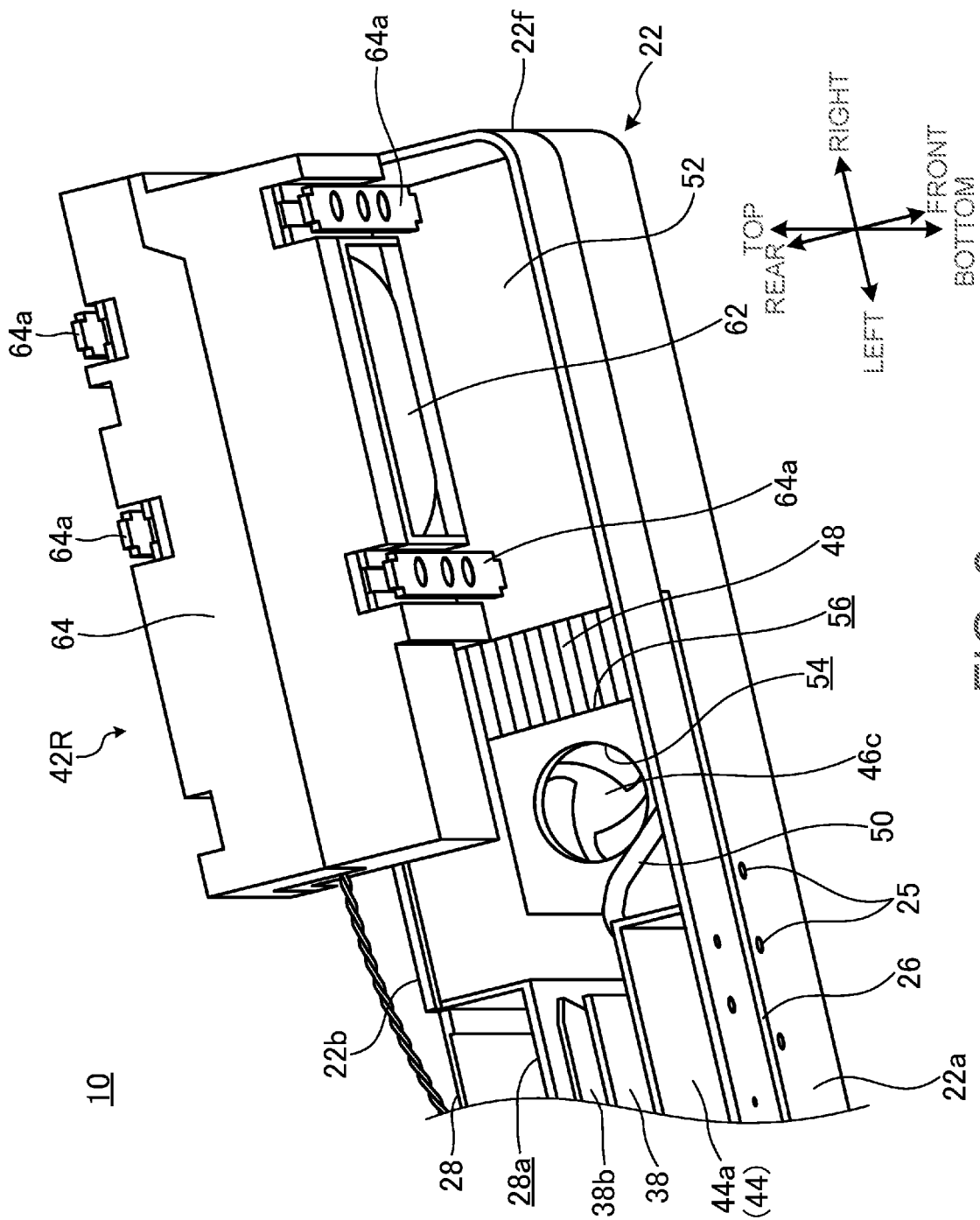
FIG. 8 is an exploded perspective view of the right-side speaker device just before being attached to the chassis according to one or more embodiments.

FIG. 7B illustrates a state where a speaker device 42R is installed above the right-side cooling device 40R illustrated in FIG. 7A. FIG. 8 is an exploded perspective view of the right-side speaker device 42R just before being attached to the chassis 22.

The speaker devices 42L and 42R are devices that output sound to the outside of the chassis 22. Specifically, the speaker devices 42L and 42R emit sound through a saran net 60 provided on the outer surface of the chassis 22 (see FIGS. 2A to 2D).

The saran net 60 is a net member that allows the sound from the speaker devices 42L and 42R to pass through to the outside of the chassis 22. A large number of holes provided in the chassis 22 may be substituted for the saran net 60. As illustrated in FIGS. 2A to 2D, in one or more embodiments, the saran net 60 is provided, for example, on the substantially lower half of the front surface 22a and side surfaces 22e and 22f of the chassis 22, and on the substantially lower half of the left and right ends of the rear surface 22b.

As illustrated in FIGS. 7B and 8, the speaker device 42R has a speaker unit 62 and a speaker box 64.

The speaker unit 62 is a part that actually outputs sound. The speaker unit 62 is, for example, a combination of a diaphragm, a magnet, and a voice coil, and may be the same as or similar to a known speaker unit.

The speaker box 64 is a box body in which a cavity is formed to serve as a back chamber of the speaker unit 62, and is also referred to as an enclosure. The speaker unit 62 is attached to the fore surface of the speaker box 64. As illustrated in FIGS. 7A and 7B, the speaker box 64 is installed above the fan 46, the fin 48, and the duct part 52 in such a way as to cover them. In other words, the speaker box 64 has the front-to-back and left-to-right widths large enough to cover the substantially entire fan 46, fin 48, and duct part 52. This allows the speaker box 64 to securely have a volume as large as possible within the chassis 22.

A pair of mounting rods 64*a* and 64*a* are fixed to the fore surface and to the back surface of the speaker box 64. The mounting rods 64*a* are strip-shaped support members for supporting the speaker device 42R in the chassis 22. The mounting rod 64*a* needs to be able to prevent the transmission of vibration of the speaker device 42R to the chassis 22, and is made of rubber, for example. The mounting rod 64*a* is inserted into a pocket portion 66 formed along the upward direction on the inner surface of the chassis 22, and its lower surface is supported by the bottom surface 22*g*. In this case, the speaker box 64 has a predetermined gap between the inner surface of the chassis 22 and the fan 46, the fin 48, and the duct part 52. In other words, the speaker box 64 is elastically supported in the chassis 22 in a practically floating state.

As illustrated in FIG. 6, the lower surface of the speaker box 64 is provided with a relief portion 64*b* whose lower surface is concave above the other portions. The relief portion 64*b* is provided just above the fan 46 and is offset one step above the duct part 52. The relief portion 64*b* is intended to avoid blocking the upper air intake port 54 of the fan 46 while minimizing the reduction of the volume of the speaker box 64.

The cooling devices 40L and 40R thus configured absorb heat from the processing device 38*a* and the like mounted on the substrate 38 by the heat pipe 50 via the heat receiving plate 58. In one or more embodiments, the left and right cooling devices 40L and 40R share one heat receiving plate 58 (see FIG. 3). One heat receiving plate 58 may be installed exclusively for each of the cooling devices 40L and 40R.

The heat transferred from the heat receiving plate 58 to the heat pipe 50 is efficiently transported by the heat pipe 50 to the fin 48 and transferred to the fin 48. The heat transferred to the fin 48 is efficiently dissipated by receiving air from the exhaust port 56 of the fan 46. The high-temperature exhaust gas that has passed through the fin 48 passes through an air duct formed by the duct part 52 and the bottom surface 22*g* of the chassis 22, and is discharged to the outside of the chassis 22 through the side exhaust ports 34L and 34R. The arrows illustrated in FIGS. 4 and 6 with one-dotted lines schematically represent the flows of air drawn by the fan 46 and air discharged by the fan 46.

In this case, the fan 46 draws air from the outside of the chassis 22 through the bottom air intake ports 32L and 32R and from the lower air intake port 55. In addition, the fan 46 draws air from the outside of the chassis 22 through the rear air intake ports 27L and 27R and from the upper air intake port 54. Although the space between the rear air intake ports 27L and 27R and the upper air intake port 54 is mostly blocked by the speaker box 64, air is drawn into the upper air intake port 54 through the gap around the speaker box 64. In this case, the speaker box 64 has a relief portion 64*b* on the lower surface just above the fan 46 (see FIG. 6). Therefore, the air is smoothly drawn through the rear air intake ports 27L and 27R to the upper air intake port 54.

As described above, the electronic apparatus 10 of one or more embodiments includes the chassis 22, the substrate 38 on which the processing device 38*a* is mounted, the speaker devices 42L and 42R, and the cooling devices 40L and 40R that cool the processing device 38*a*. Note here that the substrate 38 is placed vertically along the vertical direction of the chassis 22. The cooling devices 40L and 40R have the fan 46 and the fin 48 placed horizontally in the chassis 22, and the heat pipe 50 that connects the processing device 38*a* and the fin 48. Note that only one of the cooling devices 40L and 40R may be provided. Similarly, only one of the speaker devices 42L and 42R may be provided.

Thus, the electronic apparatus 10 houses the substrate 38, the speaker devices 42L and 42R, and the cooling devices 40L and 40R in the chassis 22. The electronic apparatus 10, however, has the substrate 38 that is placed vertically and has the fan 46 and the fin 48 that are placed horizontally, wherein the processing device 38*a* mounted on the substrate 38 is connected to the fin 48 by the heat pipe 50. This allows the electronic apparatus 10 to minimize the depth dimension D of the chassis 22 by vertically placing the substrate 38, which requires a large surface area to avoid the influence of the substrate 38 on the depth dimension D of the chassis 22. For example, the depth dimension D of the electronic apparatus 10 of one or more embodiments is 90 mm or less. As a result, when the electronic apparatus 10 is installed on a wall, the protrusion length from the wall is suppressed (see FIG. 2C). Moreover, the fan 46 and fin 48 of the electronic apparatus 10 are placed horizontally. Therefore, a large space is secured above the fan 46 and the fin 48, and the installation space for the speaker box 64 is secured here, which contributes to the increase in the volume of the speaker box 64.

In the electronic apparatus 10, the processing device 38*a* is placed above the fin 48. The heat pipe 50 connects the processing device 38*a* to the fin 48. That is, the heat pipe 50 has the bending portion 50*c*, which is curved in the vertical, horizontal, and front-back directions of the chassis 22, between the first end 50*a* and the second end 50*b*. This allows the heat pipe 50 to securely connect the processing device 38*a* and the fin 48, which are in different positions in the vertical, horizontal, and front-back directions, in the chassis 22 having a narrow depth dimension D. Moreover, the heat pipe 50 has the three-dimensional bending portion 50*c*, which prevents the pipe from being forcibly bent and the sealed space inside the pipe from being blocked, which reduces the heat transfer performance.

The cooling devices 40L and 40R have the duct part 52 that is placed facing the fin 48 under the speaker box 64 to distribute air, which has left the exhaust port 56 of the fan 46 and has passed through the fin 48, to the outside of the chassis 22. This prevents the air that has discharged from the fan 46 from leaking into the chassis 22 and reducing the air volume. This also reduces the so-called air noise and its influence on the microphone 25. The duct part 52 may be omitted if, for example, the speaker box 64 is able to be used instead.

The electronic apparatus 10 of one or more embodiments also includes the chassis 22, the substrate 38 on which the processing device 38*a* is mounted, the speaker devices 42L and 42R, and the cooling devices 40L and 40R that cool the processing device 38*a*. The cooling devices 40L and 40R have the fan 46 with the rotating shaft portion 46*b* of the impeller 46*c* placed along the vertical direction of the chassis 22, the fin 48, the heat pipe 50 that connects the processing device 38*a* to the fin 48, and the duct part 52. The duct part 52 is placed facing the fin 48 under the speaker box 64, and forms an air duct that distributes the air that has left the exhaust port 56 of the fan 46 and has passed through the fin 48 to the outside of the chassis 22.

Thus, the electronic apparatus 10 is provided with the exhaust port 56 on the side surface of the fan 46, with the fin 48 and the duct part 52 placed on the side of the exhaust port 56, and with the speaker box 64 placed thereabove. In other words, in the electronic apparatus 10, the parts of the cooling devices 40L and 40R are placed along the horizontal direction of the chassis 22, and the speaker box 64 is placed thereabove. As a result, the electronic apparatus 10 is able to efficiently house the parts within the chassis 22 while minimizing the depth dimension D of the chassis 22.

Moreover, the electronic apparatus 10 of one or more embodiments includes a pair of speaker devices 42L and 42R and a pair of cooling devices 40L and 40R, by which good sound quality and high cooling performance are obtained. In this case, the speaker devices 42L and 42R and the cooling devices 40L and 40R are placed on the left and right sides of the substrate 38 in the center, respectively, and therefore there is no need to increase the depth dimension D of the chassis 22. In addition, the electronic apparatus 10 has a good weight balance since the speaker devices 42L and 42R and the cooling devices 40L and 40R are placed equally on the left and right sides of the substrate 38 in the center.

In this case, the electronic apparatus 10 is provided with a concave portion 28a on the rear surface 22b on the back side of the substrate 38, where there are not placed the speaker devices 42L and 42R and the cooling devices 40L and 40R and where a space is relatively easy to secure in the chassis 22, and the connection terminal portion 30 is provided here. Therefore, as illustrated in FIG. 2C, the practical depth dimension of the electronic apparatus 10 does not increase due to the connector 30a and cable 30b connected to the connection terminal portion 30 when the electronic apparatus 10 is fixed by wall-hanging.

Moreover, the bracket plate 36 for fixing the electronic apparatus 10 by wall-hanging has the connecting plates 36a and 36b that are connected in the positions overlapping the cooling devices 40L and 40R and the speaker devices 42L and 42R with reference to the horizontal direction of the chassis 22. Therefore, the chassis 22 is able to directly bear the weights of the cooling devices 40L and 40R and the speaker devices 42L and 42R, which are heavier than the substrate 38, on the bracket plate 36. Therefore, in the case where the electronic apparatus 10 is fixed on the wall, the left and right sides of the chassis 22 are able to be suppressed from warping due to the weights of the cooling devices 40L and 40R and the speaker devices 42L and 42R.

The present invention is not limited to the embodiments described above, and naturally may be freely modified to the extent not to depart from the gist of the present invention.

DESCRIPTION OF SYMBOLS 10 electronic apparatus
22 chassis
27L, 27R rear air intake port
30 connection terminal portion
32L, 32R bottom air intake port
34L, 34R side exhaust port
36 bracket plate
38 substrate
38a processing device
40L, 40R cooling device
42L, 42R speaker device
46 fan
48 fin
50 heat pipe
50c bending portion
52 duct part
62 speaker unit
64 speaker box

What is claimed is:

1. An electronic apparatus, comprising:
a chassis including:
  a bottom surface perpendicular to a vertical direction of the chassis;
  a rear surface that is perpendicular to the bottom surface of the chassis; and
  a side surface that connects edges, along a left or a right direction of the chassis that is perpendicular to both the vertical direction and a horizontal direction of the chassis, of the bottom surface and the rear surface;
a substrate housed in the chassis and with a processing device mounted thereon;
a speaker device housed in the chassis and having a speaker unit and a speaker box; and
a cooling device housed in the chassis and used to cool the processing device,
wherein the substrate is placed vertically along the vertical direction of the chassis, and
wherein the cooling device includes:
  a fan having air intake ports provided on upper and lower surfaces, an exhaust port provided on a side surface, and an impeller, and being placed horizontally in the chassis with a rotating shaft of the impeller placed along the vertical direction of the chassis;
  a fin placed facing the exhaust port of the fan and placed horizontally in the chassis;
  a heat pipe with a first end connected to the processing device and a second end connected to the fin; and
  a duct part facing the fin,
wherein, viewed along the vertical direction of the chassis, the speaker box overlaps the rotating shaft of the fan, the fin, and the duct part of the cooling device, and
wherein, viewed along the left or the right direction of the chassis, the speaker box overlaps the processing device.

2. The electronic apparatus according to claim 1, wherein the processing device is placed above the fin in the vertical direction of the chassis, and
the heat pipe has a bending portion curved in the vertical, horizontal, and front-back directions of the chassis between the first end and the second end.

3. The electronic apparatus according to claim 1, wherein the speaker box is placed above the fan and the fin.

4. The electronic apparatus according to claim 3, wherein the cooling device further has the duct part, placed facing the fin under the speaker box and used to distribute air having left the exhaust port and passed through the fin to the outside of the chassis.

5. The electronic apparatus according to claim 4, wherein the chassis includes:
  a bottom air intake port being formed on the bottom surface and opposite to the air intake port provided on the lower surface of the fan;
  a rear air intake port being formed on the rear surface perpendicular to the bottom surface and communicated with the air intake port on the upper surface of the fan; and
  a side exhaust port being formed on the side surface perpendicular to the bottom surface and to the rear surface and being opposite to an outlet of the duct part.

6. An electronic apparatus, comprising:
a chassis including:
  a bottom surface perpendicular to a vertical direction of the chassis;

a rear surface that is perpendicular to the bottom surface of the chassis; and a side surface that connects edges, along a left or a right direction of the chassis that is perpendicular to both the vertical direction and a horizontal direction of the chassis, of the bottom surface and the rear surface;

a substrate housed in the chassis and with a processing device mounted thereon;

a speaker device housed in the chassis and having a speaker unit and a speaker box; and a cooling device housed in the chassis and used to cool the processing device, wherein the cooling device includes:

a fan having air intake ports provided on upper and lower surfaces, an exhaust port provided on a side surface, and an impeller, with a rotating shaft of the impeller placed along the vertical direction of the chassis;

a fin placed facing the exhaust port of the fan;

a heat pipe with a first end connected to the processing device and a second end connected to the fin; and a duct part placed facing the fin under the speaker box and used to distribute air having left the exhaust port and passed through the fin to the outside of the chassis, wherein, viewed along the vertical direction of the chassis, the speaker box overlaps the rotating shaft of the fan, the fin, and the duct of the cooling device, and wherein, viewed along the left or the right direction of the chassis, the speaker box overlaps the processing device.

7. The electronic apparatus according to claim 6, wherein the fan and the fin are placed horizontally along a bottom surface of the chassis, and the substrate is placed vertically along the vertical direction of the chassis.

8. The electronic apparatus according to claim 7, wherein the processing device is placed above the fin in the vertical direction of the chassis, and the heat pipe has a bending portion curved in the vertical, horizontal, and front-back directions of the chassis between the first end and the second end.

9. The electronic apparatus according to claim 1, wherein the substrate is placed in a position including the center of the chassis in the horizontal direction, and the speaker devices and the cooling devices are provided in pairs on the left and right sides of the substrate.

10. The electronic apparatus according to claim 9, further comprising a connection terminal portion placed behind the substrate, wherein the connection terminal portion is placed in a concave portion formed on a part of the rear surface of the chassis.

* * * * *